(12) United States Patent
Haba

(10) Patent No.: US 12,176,294 B2
(45) Date of Patent: Dec. 24, 2024

(54) BONDED STRUCTURE WITH INTERCONNECT STRUCTURE

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: ADEIA SEMICONDUCTOR BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 18/339,137

(22) Filed: Jun. 21, 2023

(65) Prior Publication Data

US 2024/0170406 A1 May 23, 2024

Related U.S. Application Data

(63) Continuation of application No. 17/171,351, filed on Feb. 9, 2021, now Pat. No. 11,728,273.

(Continued)

(51) Int. Cl.
*H01L 23/538* (2006.01)
*H01L 23/00* (2006.01)
*H01L 25/065* (2023.01)

(52) U.S. Cl.
CPC .......... *H01L 23/5383* (2013.01); *H01L 24/08* (2013.01); *H01L 24/80* (2013.01);
(Continued)

(58) Field of Classification Search
CPC ..... H01L 23/5383; H01L 24/08; H01L 24/80; H01L 24/96; H01L 24/3497; H01L 25/0652; H01L 25/0655
See application file for complete search history.

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| EP | 1011133 A1 | 6/2000 |

(Continued)

OTHER PUBLICATIONS

Michailos, Jean, "Future landscape for 3D Integration: from Interposers to 3D High Density," 3d ASIP—Dec. 13-15, 2016, San Francisco Airport, USA, 46 pages.

(Continued)

*Primary Examiner* — Nathan W Ha
(74) *Attorney, Agent, or Firm* — Knobbe, Martens, Olson & Bear, LLP

(57) ABSTRACT

A bonded structure is disclosed. The bonded structure can include an interconnect structure that has a first side and a second side opposite the first side. The bonded structure can also include a first die that is mounted to the first side of the interconnect structure. The first die can be directly bonded to the interconnect structure without an intervening adhesive. The bonded structure can also include a second die that is mounted to the first side of the interconnect structure. The bonded structure can further include an element that is mounted to the second side of the interconnect structure. The first die and the second die are electrically connected by way of at least the interconnect structure and the element.

16 Claims, 8 Drawing Sheets

Related U.S. Application Data

(60) Provisional application No. 63/075,038, filed on Sep. 4, 2020.

(52) U.S. Cl.
CPC .............. H01L 24/96 (2013.01); H01L 24/97 (2013.01); H01L 25/0652 (2013.01); H01L 25/0655 (2013.01); *H01L 2224/08155* (2013.01); *H01L 2224/80001* (2013.01)

(56) References Cited

U.S. PATENT DOCUMENTS

| | | |
|---|---|---|
| 5,051,802 A | 9/1991 | Prost et al. |
| 5,087,585 A | 2/1992 | Hayashi |
| 5,322,593 A | 6/1994 | Hasegawa et al. |
| 5,729,896 A | 3/1998 | Dalal et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,410,983 B1 | 6/2002 | Moriizumi et al. |
| 6,423,640 B1 | 7/2002 | Lee et al. |
| 6,465,892 B1 | 10/2002 | Suga |
| 6,500,694 B1 | 12/2002 | Enquist |
| 6,582,991 B1 | 6/2003 | Maeda et al. |
| 6,768,208 B2 | 7/2004 | Lin et al. |
| 6,782,610 B1 | 8/2004 | Iijima et al. |
| 6,867,073 B1 | 3/2005 | Enquist |
| 6,887,769 B2 | 5/2005 | Kellar et al. |
| 6,908,027 B2 | 6/2005 | Tolchinsky et al. |
| 6,962,835 B2 | 11/2005 | Tong et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,319,197 B2 | 1/2008 | Oggioni et al. |
| 7,354,798 B2 | 4/2008 | Pogge et al. |
| 7,385,283 B2 | 6/2008 | Wu et al. |
| 7,554,203 B2 | 6/2009 | Zhou et al. |
| 7,566,634 B2 | 7/2009 | Beyne et al. |
| 7,582,971 B2 | 9/2009 | Kameyama et al. |
| 7,589,409 B2 | 9/2009 | Gibson et al. |
| 7,663,231 B2 | 2/2010 | Chang et al. |
| 7,750,488 B2 | 7/2010 | Patti et al. |
| 7,759,751 B2 | 7/2010 | Ono |
| 7,786,572 B2 | 8/2010 | Chen |
| 7,803,693 B2 | 9/2010 | Trezza |
| 7,816,856 B2 | 10/2010 | Cok et al. |
| 7,843,052 B1 | 11/2010 | Yoo et al. |
| 7,897,481 B2 | 3/2011 | Chiou et al. |
| 7,932,616 B2 | 4/2011 | Meguro |
| 7,977,789 B2 | 7/2011 | Park |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Patti et al. |
| 8,193,632 B2 | 6/2012 | Chang et al. |
| 8,227,904 B2 | 7/2012 | Braunisch et al. |
| 8,241,961 B2 | 8/2012 | Kim et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,519,514 B2 | 8/2013 | Fujii |
| 8,524,533 B2 | 9/2013 | Tong et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,878,353 B2 | 11/2014 | Haba et al. |
| 8,901,748 B2 | 12/2014 | Manusharow et al. |
| 8,912,670 B2 | 12/2014 | Teh et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,006,908 B2 | 4/2015 | Pincu et al. |
| 9,029,242 B2 | 5/2015 | Holden et al. |
| 9,054,101 B2 | 6/2015 | Semmelmeyer et al. |
| 9,059,179 B2 | 6/2015 | Karikalan et al. |
| 9,093,350 B2 | 7/2015 | Endo et al. |
| 9,126,236 B2 | 9/2015 | Roos et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |
| 9,171,816 B2 | 10/2015 | Teh et al. |
| 9,184,125 B2 | 11/2015 | Enquist et al. |
| 9,190,380 B2 | 11/2015 | Teh et al. |
| 9,224,697 B1 | 12/2015 | Kwon et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,431,371 B2 | 8/2016 | Karikalan et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,818,729 B1 | 11/2017 | Chiu et al. |

(56) References Cited

U.S. PATENT DOCUMENTS

| | | |
|---|---|---|
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 * | 5/2018 | Yu .................... H01L 24/20 |
| 10,008,844 B2 | 6/2018 | Wang et al. |
| 10,026,605 B2 | 7/2018 | Doub et al. |
| 10,032,722 B2 | 7/2018 | Yu et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,529,690 B2 | 1/2020 | Shih et al. |
| 10,559,507 B1 | 2/2020 | Saketi et al. |
| 10,629,567 B2 | 4/2020 | Uzoh et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,626 B2 | 10/2021 | Hwang et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |
| 11,728,273 B2 * | 8/2023 | Haba .................. H01L 23/5385 |
| | | 257/777 |
| 11,764,177 B2 | 9/2023 | Haba |
| 11,764,189 B2 | 9/2023 | Gao et al. |
| 11,817,409 B2 | 11/2023 | Haba et al. |
| 11,837,582 B2 | 12/2023 | Gao et al. |
| 11,916,076 B2 | 2/2024 | DeLaCruz et al. |
| 11,935,907 B2 | 3/2024 | Katkar |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0133930 A1 | 6/2005 | Savastisuk et al. |
| 2005/0153522 A1 | 7/2005 | Hwang et al. |
| 2005/0218518 A1 | 10/2005 | Jiang et al. |
| 2006/0057945 A1 | 3/2006 | Hsu et al. |
| 2006/0087042 A1 | 4/2006 | Kameyama et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0231311 A1 | 9/2008 | Condorelli et al. |
| 2008/0265421 A1 | 10/2008 | Brunnbauer et al. |
| 2008/0308928 A1 | 12/2008 | Chang |
| 2009/0068831 A1 | 3/2009 | Enquist et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0123268 A1 | 5/2010 | Menard |
| 2010/0129999 A1 | 5/2010 | Zingher et al. |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0327424 A1 | 12/2010 | Braunisch et al. |
| 2011/0074033 A1 | 3/2011 | Kaltalioglu et al. |
| 2011/0186977 A1 | 8/2011 | Chi et al. |
| 2011/0290552 A1 | 12/2011 | Palmateer et al. |
| 2012/0025396 A1 | 2/2012 | Liao et al. |
| 2012/0049344 A1 | 3/2012 | Pagaila et al. |
| 2012/0074585 A1 | 3/2012 | Koo et al. |

(56) References Cited

U.S. PATENT DOCUMENTS

| | | |
|---|---|---|
| 2012/0119360 A1 | 5/2012 | Kim et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0217644 A1 | 8/2012 | Pagaila |
| 2013/0009325 A1 | 1/2013 | Mori |
| 2013/0037936 A1 | 2/2013 | Choi et al. |
| 2013/0037962 A1 | 2/2013 | Xue |
| 2013/0082399 A1 | 4/2013 | Kim et al. |
| 2013/0122655 A1 | 5/2013 | Yu et al. |
| 2013/0265733 A1 | 10/2013 | Herbsommer et al. |
| 2013/0299997 A1 | 11/2013 | Sadaka |
| 2013/0334697 A1 | 12/2013 | Shin et al. |
| 2014/0013606 A1 | 1/2014 | Nah et al. |
| 2014/0071652 A1 | 3/2014 | McShane et al. |
| 2014/0154839 A1 | 6/2014 | Ahn et al. |
| 2014/0175655 A1 | 6/2014 | Chen et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0064498 A1 | 3/2015 | Tong |
| 2015/0102468 A1 | 4/2015 | Kang et al. |
| 2015/0113195 A1 | 4/2015 | Kim |
| 2015/0130082 A1 | 5/2015 | Lu et al. |
| 2015/0171050 A1 | 6/2015 | Chen et al. |
| 2015/0179481 A1 | 6/2015 | Lin |
| 2015/0194406 A1 | 7/2015 | Teh et al. |
| 2015/0206865 A1 | 7/2015 | Yu et al. |
| 2015/0235991 A1 | 8/2015 | Gu et al. |
| 2015/0262845 A1 | 9/2015 | Hwang et al. |
| 2015/0270209 A1 | 9/2015 | Woychik et al. |
| 2015/0340285 A1 | 11/2015 | Enquest et al. |
| 2016/0126634 A1 | 5/2016 | Liu et al. |
| 2016/0163650 A1 | 6/2016 | Gao et al. |
| 2016/0260684 A1 | 9/2016 | Zhai et al. |
| 2016/0300813 A1 | 10/2016 | Zhai et al. |
| 2016/0300817 A1 | 10/2016 | Do et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1 | 11/2016 | Lin et al. |
| 2016/0372323 A1 | 12/2016 | Doub et al. |
| 2017/0023405 A1 | 1/2017 | Fahim et al. |
| 2017/0062366 A1 | 3/2017 | Enquist |
| 2017/0062383 A1 | 3/2017 | Yee et al. |
| 2017/0084576 A1 | 3/2017 | Yu et al. |
| 2017/0179078 A1 | 4/2017 | Yu et al. |
| 2017/0125379 A1 | 5/2017 | Chen et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0263595 A1 | 9/2017 | Kurita et al. |
| 2017/0287874 A1 | 10/2017 | Fang et al. |
| 2017/0338214 A1 | 11/2017 | Uzoh et al. |
| 2017/0345761 A1 | 11/2017 | Yu et al. |
| 2017/0365580 A1 | 12/2017 | Shih et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0026008 A1 | 1/2018 | Jeng et al. |
| 2018/0053746 A1 | 2/2018 | Yu et al. |
| 2018/0068958 A1 | 3/2018 | Cho et al. |
| 2018/0068978 A1 | 3/2018 | Jeng et al. |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0151477 A1 | 5/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0103409 A1 | 4/2019 | Xu et al. |
| 2019/0115277 A1 | 4/2019 | Yu et al. |
| 2019/0131277 A1 | 5/2019 | Yang et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0221548 A1 | 7/2019 | Huang et al. |
| 2019/0265411 A1 | 8/2019 | Huang et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0348336 A1 | 11/2019 | Katkar et al. |
| 2019/0355706 A1 | 11/2019 | Enquist et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1* | 9/2020 | Hariri ................ H01L 23/5385 |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1* | 12/2020 | Xie .................... H01L 23/5386 |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1* | 1/2021 | Hu .................... H01L 23/5386 |
| 2021/0028080 A1* | 1/2021 | Pietambaram ...... H01L 25/0652 |
| 2021/0057343 A1 | 2/2021 | Chang et al. |
| 2021/0057352 A1* | 2/2021 | Agarwal ............ H01L 21/4857 |
| 2021/0066219 A1* | 3/2021 | Chen .................. H01L 23/66 |
| 2021/0082797 A1* | 3/2021 | Lee .................. H01L 23/49822 |

(56) References Cited

U.S. PATENT DOCUMENTS

| | | |
|---|---|---|
| 2021/0082822 A1* | 3/2021 | Aleksov ............... H01L 24/25 |
| 2021/0082825 A1* | 3/2021 | Strong ............... H01L 23/5386 |
| 2021/0098411 A1 | 4/2021 | Liff et al. |
| 2021/0098412 A1 | 4/2021 | Haba et al. |
| 2021/0098421 A1* | 4/2021 | Wu ............... H01L 23/49811 |
| 2021/0111125 A1* | 4/2021 | Chen ............... H01L 23/5386 |
| 2021/0118864 A1 | 4/2021 | DeLaCruz et al. |
| 2021/0125933 A1* | 4/2021 | Chen ............... H01L 23/3128 |
| 2021/0125965 A1* | 4/2021 | Lu ............... H01L 25/0657 |
| 2021/0134724 A1* | 5/2021 | Rubin ............... H01L 23/5385 |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1* | 7/2021 | Wu ............... H01L 25/0652 |
| 2021/0225780 A1* | 7/2021 | Wu ............... H01L 21/486 |
| 2021/0242152 A1 | 8/2021 | Fountain, Jr. et al. |
| 2021/0280507 A1* | 9/2021 | Aldrete ............... H01L 21/568 |
| 2021/0280517 A1* | 9/2021 | May ............... H01L 25/0655 |
| 2021/0280522 A1* | 9/2021 | Liu ............... H01L 21/4857 |
| 2021/0296282 A1 | 9/2021 | Gao et al. |
| 2021/0305122 A1* | 9/2021 | Lai ............... H01L 23/5383 |
| 2021/0305202 A1 | 9/2021 | Uzoh et al. |
| 2021/0335726 A1* | 10/2021 | Wu ............... H01L 23/5381 |
| 2021/0366820 A1 | 11/2021 | Uzoh |
| 2021/0366970 A1 | 11/2021 | Katkar |
| 2021/0375708 A1* | 12/2021 | Kuo ............... H01L 24/05 |
| 2021/0375737 A1* | 12/2021 | Lin ............... H01L 21/4853 |
| 2021/0384133 A1* | 12/2021 | Ong ............... H01L 23/5384 |
| 2021/0384135 A1* | 12/2021 | Kuan ............... H01L 23/5384 |
| 2021/0391271 A1* | 12/2021 | Hsu ............... H01L 25/16 |
| 2021/0391272 A1* | 12/2021 | Tsai ............... H01L 23/481 |
| 2021/0391283 A1* | 12/2021 | Hsu ............... H01L 25/18 |
| 2021/0391284 A1* | 12/2021 | Hsu ............... H01L 23/3128 |
| 2021/0407941 A1 | 12/2021 | Haba |
| 2022/0005787 A1* | 1/2022 | Han ............... H01L 23/49822 |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1* | 9/2022 | Ong ............... H01L 25/16 |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215739 A1 | 7/2023 | Haba et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420398 A1 | 12/2023 | Haba |
| 2023/0420399 A1 | 12/2023 | Haba et al. |
| 2024/0006377 A1 | 1/2024 | Wang et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170406 A1 | 5/2024 | Haba |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2007-294724 A | 11/2007 |
| JP | 2008-130603 A | 6/2008 |
| JP | 2010-034294 A | 2/2010 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2010-0123755 | 11/2010 |
| KR | 10-2015-0097798 | 8/2015 |
| KR | 10-2018-0054419 | 5/2018 |
| KR | 10-2020-0060670 | 6/2020 |
| KR | 10-2020-0092236 | 8/2020 |
| TW | I464810 B | 12/2014 |
| WO | WO 2005/043584 A2 | 5/2005 |
| WO | WO 2006/100444 A1 | 9/2006 |
| WO | WO 2008/112101 A2 | 9/2008 |
| WO | WO 2010/024678 A1 | 3/2010 |
| WO | WO 2017/034654 A1 | 3/2017 |
| WO | WO 2017/052652 A1 | 3/2017 |
| WO | WO 2017/151442 A1 | 9/2017 |
| WO | WO 2019/054364 | 3/2019 |
| WO | WO 2022/218624 A1 | 10/2022 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.

Braunisch, H. et al., "High-speed performance of silicon bridge die-to-die interconnects," 2011 IEEE, pp. 95-98.

Chung et al., "Room temperature GaAseu + Si and InPeu + Si wafer direct bonding by the surface activate bonding method," Nuclear

(56) References Cited

OTHER PUBLICATIONS

Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting 5-7.12.2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
International Search Report mailed Dec. 8, 2021, issued in International Application No. PCT/US2021/046749, 4 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Khan et al., "Technologies for printing sensors and electronics over large flexible substrates," IEEE Sensors Journal, Jun. 2015, vol. 15, No. 6, pp. 3164-3185.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Conference, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.

(56) References Cited

OTHER PUBLICATIONS

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

* cited by examiner

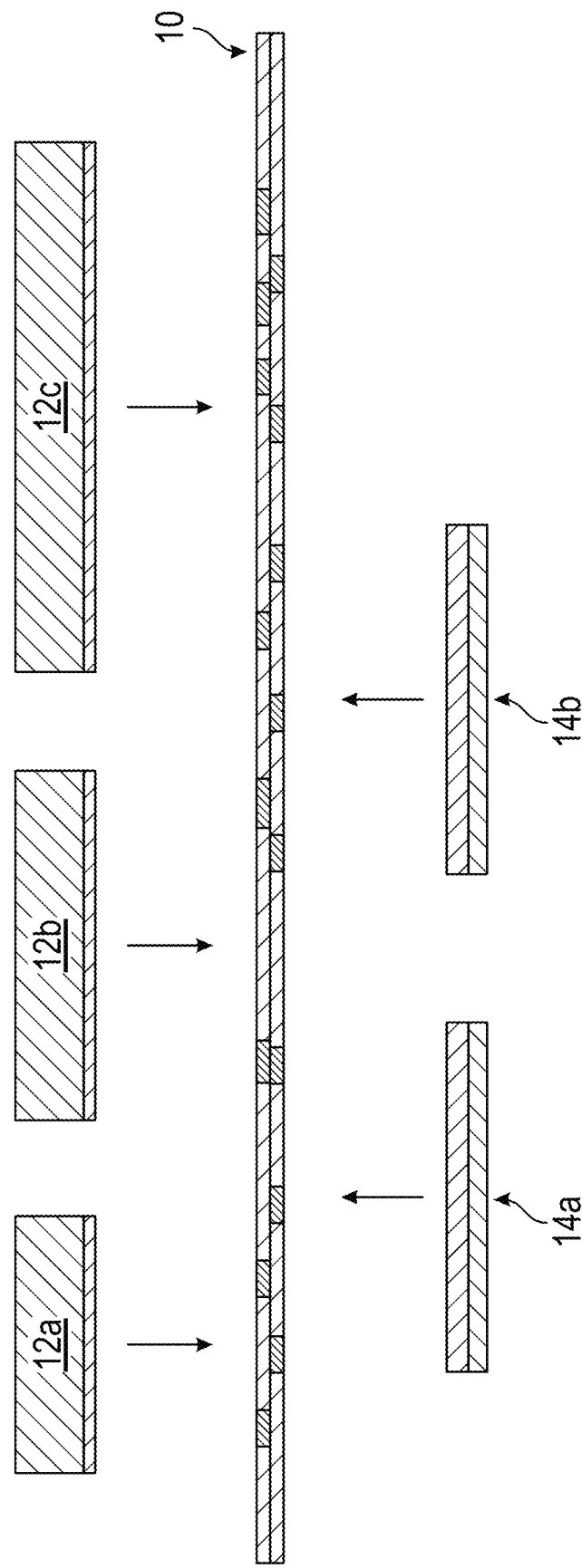

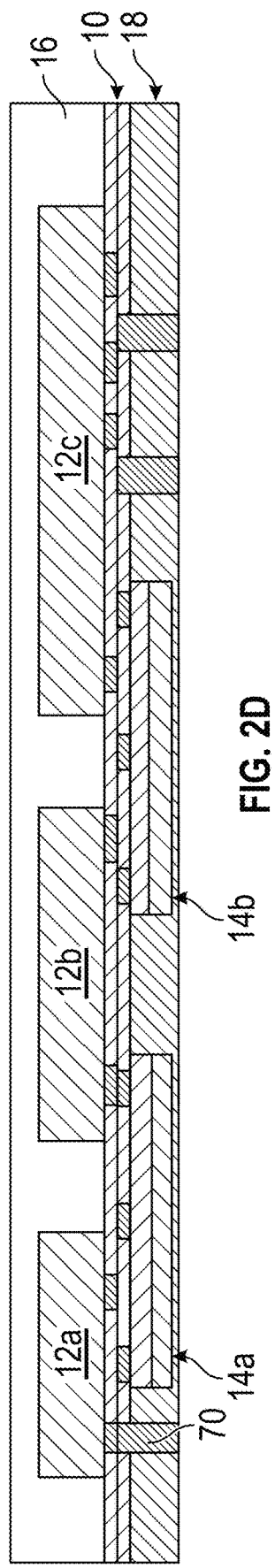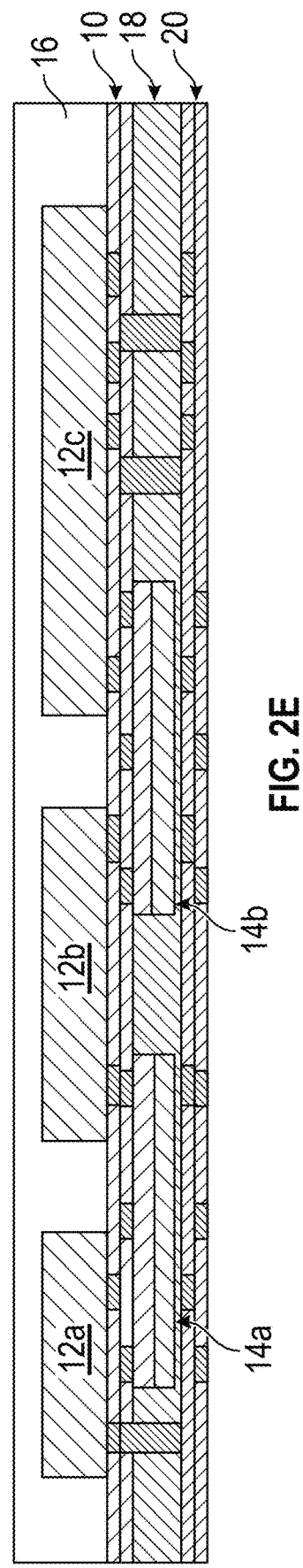

BONDED STRUCTURE WITH INTERCONNECT STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The field generally relates to bonded structures, and in particular, to bonded structures with an interconnect structure.

Description of the Related Art

An electronic component can be connected to a redistribution layer (RDL), which can comprise conductive routing traces to route signals laterally outside the footprint of the electronic component. The RDL can be formed on the electronic component by way of a deposition process. When the RDL is formed, there can be misalignments between the conductive portions of the RDL and contact pads of the electronic component. Accordingly, there remains a continuing need for improved structures and methods for manufacturing an electronic component.

BRIEF DESCRIPTION OF THE DRAWINGS

Specific implementations will now be described with reference to the following drawings, which are provided by way of example, and not limitation.

FIG. 1A shows a schematic side view of integrated device dies and a plurality of elements prior to being mounted to an interconnect structure.

FIG. 2D shows another step in the process of manufacturing a bonded structure after FIG. 2C.

FIG. 2E shows another step in the process of manufacturing a bonded structure after FIG. 2D.

DETAILED DESCRIPTION OF THE PREFERRED EMBODIMENT

Figure 1B:
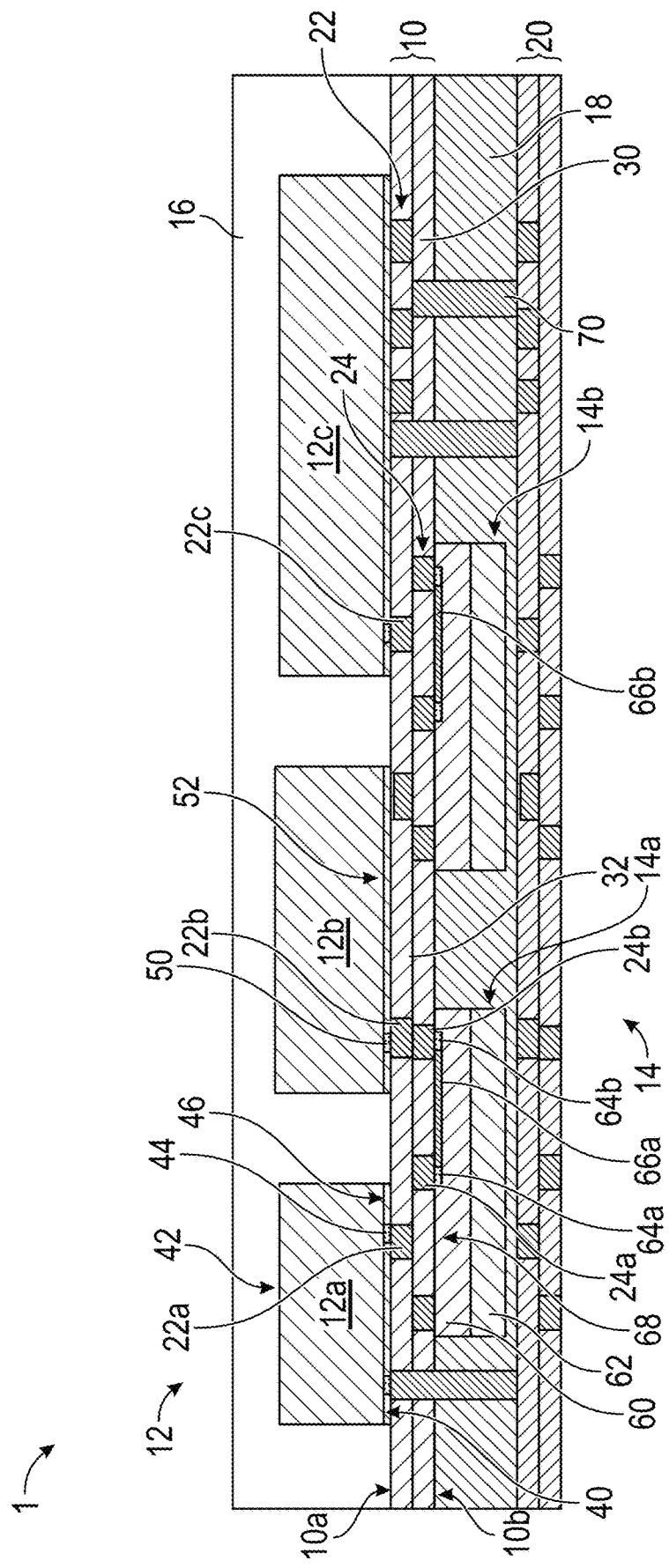
FIG. 1B shows a schematic cross sectional side view of a bonded structure according to an embodiment.

Integrated device packages can use a redistribution layer (RDL) to redistribute signals from one or more integrated device dies in the package to other devices (e.g., other devices outside the footprint of the integrated device die). For example, fan-out redistribution can convey signals from finely-pitched bond pads of an integrated device die to other devices laterally spaced from the die. In some implementations, the fan-out RDL can convey signals from a die to leads or contact pads configured to connect to a system board (e.g., a printed circuit board, or PCB). In some implementations, the fan-out RDL can convey signals from the die to other devices, such as other integrated device dies, etc. In some packages that include multiple integrated device dies, the dies may be mounted to a sacrificial carrier, and a molding compound can be provided over the dies and carrier. The sacrificial carrier can be removed, and the molded device dies can be flipped over. The RDL can be deposited over the molding compound and the device dies to form a reconstituted wafer. The reconstituted wafer can be singulated into a plurality of packages, with each package including one or multiple dies connected to an RDL.

However, in reconstituted wafers that utilize a deposited RDL, the dies may have small misalignments relative to their intended position, e.g., rotational and/or translational misalignments. When hundreds or thousands of dies are misaligned across a reconstituted wafer, misalignment of the deposited RDL may accordingly be magnified by a significant amount. In such situations, the misalignment can be compensated for by using a coarse pitch on the die(s) and/or a limited number of interconnects between the dies. However, it may be undesirable to reduce the number of contact pads on the die and/or the number of interconnects between dies. The misalignment problem can be compounded when more than two dies are used in a system. Accordingly, there remains a continuing need for improved alignment of integrated device dies in packages that utilize fan-out redistribution.

Various embodiments disclosed herein can beneficially ensure that multiple device dies are aligned relative to one another by mounting (e.g., directly bonding) the device dies to an interconnect structure (e.g., an RDL) which can serve as an alignment layer to accurately align the dies relative to one another and/or a desired position in the reconstituted wafer. One or more elements can be mounted (e.g., directly bonded) to an opposite side of the interconnect structure to electrically connect laterally spaced device dies. Molding compound can be provided over one or both sides of the interconnect structure, dies, and elements. Directly bonding the device dies and/or connecting elements to a common interconnect structure (e.g., an alignment layer serving as an RDL) can improve alignment between dies. The reconstituted wafer can be singulated to form a plurality of packages, with each package including multiple device dies and connecting elements on opposing sides of the interconnect structure.

Two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure.

Referring to FIGS. 1A and 1B, in some embodiments, the elements (e.g., a plurality of dies 12 and an interconnect structure 10) are directly bonded to one another without an adhesive. In various embodiments, a non-conductive material 46 of a first element (e.g., a first semiconductor device die with active circuitry or the first integrated device die 12) can be directly bonded to a corresponding dielectric field region (e.g., a non-conductive material 30) of a second element (e.g., a second semiconductor device die with active circuitry or the interconnect structure 10) without an adhesive. The non-conductive material 46 can be referred to as a nonconductive bonding region of the first element. In some embodiments, the non-conductive material of the first element can be directly bonded to the corresponding dielectric field region of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of Direct Bond Interconnect, or DBI®, techniques can enable high density of pads connected across the direct bond interface (e.g., small or fine pitches for regular arrays). In some embodiments, the pitch of the bonding pads may be less 40 microns or less than 10 microns or even less than 2 microns. For some applications the ratio of the pitch of the bonding pads to one of the dimensions of the bonding pad is less than 5, or less than 3 and sometimes desirably less than 2. In various embodiments, the contact pads can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

FIG. 1A shows a schematic side view of integrated device dies 12a-12c and a plurality of elements 14a-14b prior to being mounted to an interconnect structure 10. FIG. 1B shows a schematic cross sectional side view of a bonded structure 1 according to an embodiment. The bonded structure 1 of FIG. 1B may represent a singulated structure that has been separated (e.g., by sawing or punching) from a reconstituted wafer. The bonded structure 1 can include an interconnect structure 10 that has a first side 10a and a second side 10b, a plurality of integrated device dies 12 (e.g., a first die 12a, a second die 12b, and a third die 12c) that are mounted to the first side 10a of the interconnect structure 10, and a plurality of connecting elements 14 (e.g., a first element 14a and a second element 14b) that are mounted to the second side 10b of the interconnect structure 10. The bonded structure can also include a first molding material 16 disposed on the first side 10a of the interconnect structure, a second molding material 18 disposed on the second side 10b of the interconnect structure, and a second interconnect structure 20.

The first side 10a of the interconnect structure 10 can comprise a plurality of conductive contact pads 22 (e.g., a first contact pad 22a, a second contact pad 22b, and a third contact pad 22c), and the second side 10b of the interconnect structure 10 can comprise a plurality of conductive contact pads 24 (e.g., a first contact pad 24a, a second contact pad 24b). In some embodiments, the first contact pad 22a and the first contact pad 24a can be electrically connected, and the second contact 22b and the second contact pad 24b can be electrically connected. The first contact pad 22a can be laterally offset relative to the first contact pad 24a. The second contact pad 22b can be laterally offset relative to the second contact pad 24b. In some embodiments, the interconnect structure 10 can comprise a redistribution layer (RDL). The interconnect structure 10 can comprise a non-conductive material 30, a plurality of conductive lines 32 formed in the non-conductive material 30, a plurality of conductive vias (not illustrated) formed in the non-conductive material 30. The non-conductive material 30 can comprise any suitable material. For example, the non-conductive material 30 can comprise a dielectric material, such as silicon oxide, or a polymer such as polyimide. In some embodiments, the conductive lines 32 can comprise a power line for providing power to the dies 12. In some embodiments, the conductive lines 32 can comprise signal lines for transferring signals between the dies 12a-12c. In some embodiments, the conductive lines 32 can transfer or redistribute signals laterally between contact pads (e.g., the first contact pad 22a and the second pad 22b) on the first side 10a and contact pads (e.g., the first contact pad 24a and the second contact pad 24b) on the second side 10b.

The interconnect structure 10 can be provided by way of a transfer process. For example, in some embodiments, the interconnect structure 10 (e.g., an RDL) can be formed on a carrier (such as a semiconductor or glass carrier) and directly bonded to the plurality of dies 12. The carrier can be removed from the interconnect structure 10 to transfer the RDL to the plurality of dies 12. Therefore, in some embodiments, the interconnect structure 10 can comprise a transfer RDL. The first, second, and third dies 12a, 12b, 12c can be spaced apart from one another along the first side 10a of the interconnect structure 10. The interconnect structure 10 can beneficially serve to align multiple dies 12a, 12b, 12c and elements 14 relative to a common interconnect structure 10 (e.g., RDL).

In some embodiments, one or more of the plurality of integrated device dies 12 can be flip-chip mounted to the interconnect structure 10. The plurality of integrated device dies 12 can comprise any suitable type of device die. For example, one or more of the plurality of integrated device dies 12 can comprise an electronic component such as a processor die, a memory die, a microelectromechanical systems (MEMS) die, an optical device, or any other suitable type of device die. In other embodiments, the electronic component can comprise a passive device such as a capacitor, inductor, or other surface-mounted device. Circuitry (such as active components like transistors) can be patterned at or near active surface(s) of one or more of the plurality of integrated device dies 12 in various embodiments. The active surfaces may be on a side of one or more of the plurality of integrated device dies 12 which is opposite respective backsides of the one or more of the plurality of integrated device dies 12. The backsides may or may not include any active circuitry or passive devices. The first integrated device die 12 and the second integrated device die 14 may be the same type of integrated device die or a different type of device die.

The first die 12a can comprise a bonding surface 40 and a back surface 42 opposite the bonding surface 40. The bonding surface 40 can have a plurality of conductive bond pads including a conductive bond pad 44, and a non-conductive material 46 proximate to the conductive bond pad 44. In some embodiments, the conductive bond pad 44 can be bonded to the first conductive pad 22a, and the non-conductive material 46 can be bonded to a portion of the non-conductive material 30. In some embodiments, the conductive bond pad 44 can be directly bonded to the first conductive pad 22a without an intervening adhesive, and the non-conductive material 46 can be directly bonded to the portion of the non-conductive material 30 without an intervening adhesive. The non-conductive materials 46, 30 and conductive pads 44, 22a can be directly bonded without an adhesive as described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes. In some embodiments, the plurality of integrated device dies 12 can alternatively be bonded to the interconnect structure 10 by way of a thermal conductive bonding (TCB).

The second die 12b and the third die 12c can be bonded to the interconnect structure in a similar manner as the first die 12a. In some embodiments, the second die 12b can comprise a plurality of contact pads including conductive contact pad 50 that can be bonded to the conductive contact pad 22b of the interconnect structure 10, and a non-conductive material 52 that can be bonded to a portion of the non-conductive material 30 of the interconnect structure 10. In some embodiments, the second die 12b can comprise a conductive contact pad 50 that can be directly bonded to the conductive contact pad 22b of the interconnect structure 10 without an intervening adhesive, and a non-conductive material 52 that can be directly bonded to a portion of the non-conductive material 30 of the interconnect structure 10 without an intervening adhesive.

In some embodiments, the plurality of elements 14 (e.g., the first element 14a and the second element 14b) can comprise an interconnect layer 60 and an element body 62. In some embodiments, the interconnect layer 60 can comprise a redistribution layer (RDL) with conductors embedded in an insulating or nonconductive material. In some embodiments, the element body 62 can comprise a substrate, such as a silicon substrate, a glass substrate, etc. In some embodiments, the element body 62 can comprise an integrated device die. In some embodiments, the plurality of elements 14 can comprise a high density interconnect substrate. The elements 14 can beneficially provide electrical communication between the dies 12a, 12b, 12c by connecting to conductors in the interconnect structure 10 that connect to the dies 12a-12c. In some arrangements, the interconnect structure 10 can include traces that laterally electrically connect the dies 12a-12c. However, the interconnect structure 10 may comprise one or a few layers, which may not be sufficient for providing dense signal lines between the dies 12a-12c. Beneficially, the elements 14 can include numerous or dense interconnects and signal lines that can convey a significant number of signals between the dies 12a-12c. For example, in some embodiments, the interconnect structure 10 can vertically transfer signals from the pads of the die 12a to the element 14a by way of vias in the interconnect structure 10. The first element 14a can transfer the signals laterally by way of traces or conductors 66a within the element. The signals can be transferred vertically to the die 12b by way of vias in the interconnect structure 10. The second element 14b can transfer signals laterally by way of traces or conductors 66b within the element.

The first element 14a can comprise a first conductive contact pad 64a, and a second conductive contact pad 64b. The first conductive contact pad 64a and the second conductive contact pad 64b can be electrically coupled to each other by way of a conductive line 66a. The first and second conductive pads 64a, 64b can be bonded to corresponding pads on the second side 10b of the interconnect structure 10. In some embodiments, the first and second conductive pads 64a, 64b can be bonded to corresponding pads on the second side 10b of the interconnect structure 10, in the same or generally similar manner as how the conductive contact pad 44 of the first die 12a is bonded to the conductive contact pad 22a of the interconnect structure. The element 14b can also comprise a non-conductive material 68 that is bonded to the second side 10b of the interconnect structure 10. In some embodiments, the non-conductive material 68 can be directly bonded to a portion of the non-conductive material 30 at the second side 10b of the interconnect structure 10, in the same or generally similar manner as how the non-conductive material 46 of the first die 12a is bonded to a portion the non-conductive material 30 at the first side 10a of the interconnect structure 10.

The interconnect structure 10 and the first element 14a can define at least a portion of a conductive pathway between the first die 12a and the second die 12b. In some embodiments, the first element 14a and the second element 14b can be generally similar. For example, the first element 14a and the second element 14b can be identically structured. In other embodiments, the first element 14a and the second element 14b can comprise different structures. Although in FIG. 1B, the first element 14a defines a portion of the conductive pathway between the two adjacent dies (the first die 12a and the second die 12b), in some embodiments, an element may define at least a portion of a conductive pathway between two or more adjacent dies, or two or more remotely located dies on the interconnect structure 10. Electrically coupling the dies 12 to each other only through the interconnect structure 10 (e.g., an RDL, without the elements 14a, 14b) can cause certain problems and difficulties. For example, forming a conductive routing in the RDL for two or more dies 12 may require a complicated multi-layer structure and the RDL may not be able to provide enough density for proper connection between the dies 12. Also, forming a conductive routing for two or more dies 12 in the interconnect structure can be relatively expensive. Therefore, the elements 14 can provide solutions to these problems and difficulties associated with having the conductive routing for dies 12 in the interconnect structure 10.

The first molding material 16 can comprise a polymer, epoxy, resin, or the like material. In some embodiments, the first molding material 16 provide mechanical support for the first integrated device die 12a, the second integrated device die 12b and/or the third integrated device die 12c. In some embodiments, the first molding material 16 can at least partially be disposed about the first integrated device die 12a, the second integrated device die 12b, and the third integrated device die 12c.

The second molding material 18 can comprise the same or generally similar material as the first material 18. In some embodiments, the first molding material 16 and the second molding material 18 can comprise functionally similar materials. The second molding material 18 can comprise a polymer, epoxy, resin, or the like material. In some embodiments, the second molding material 18 provide mechanical support for the first element 14a and/or the second element 14b. In some embodiments, the second molding material 18 can at least partially be disposed about the first element 14a and the second element 14b.

The bonded structure 1 can further include a conductive via 70 formed at least in the second molding material 18. In some embodiments, the conductive via 70 can extend at least partially though a thickness of the second molding material 18. In some embodiments, the conductive via 70 can extend from the second side 10b of the interconnect structure 10 to the second interconnect structure 20. In some embodiments, the conductive via 70 can extend from the first side 10a of the interconnect structure 10 to the second interconnect structure 20, thereby being in direct contact with one of the plurality of dies 12.

The second interconnect structure 20 can comprise the same or generally similar structure as the first interconnect structure 10. In some embodiments, the first interconnect structure 10 and the second interconnect structure 20 can comprise functionally similar structures.

Figure 2A:
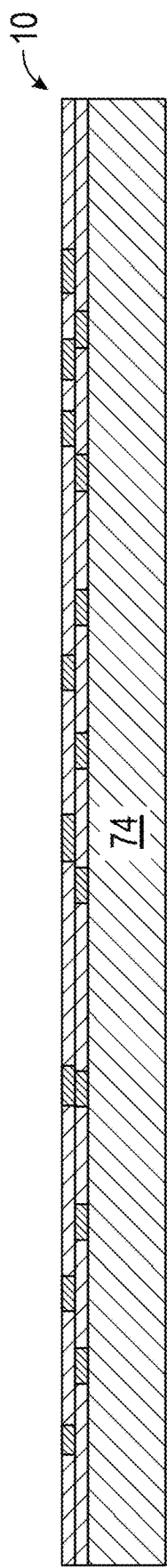
FIG. 2A shows a step in a process of manufacturing a bonded structure according to an embodiment.
Figure 2B:
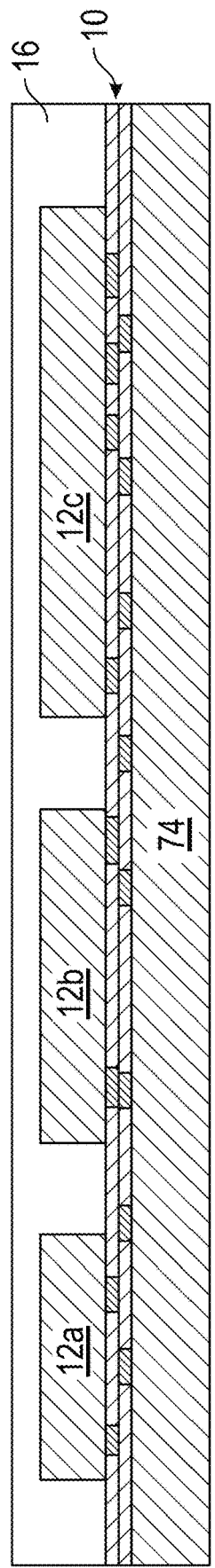
FIG. 2B shows another step in the process of manufacturing a bonded structure after FIG. 2A.
Figure 2C:
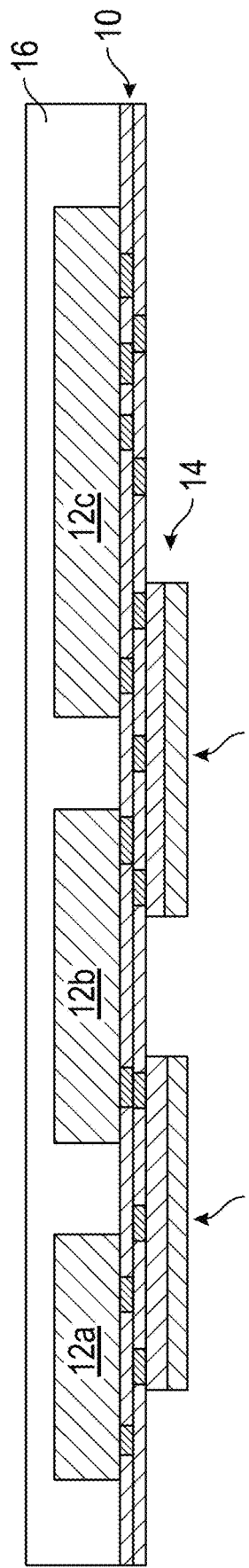
FIG. 2C shows another step in the process of manufacturing a bonded structure after FIG. 2B.

FIGS. 2A-2E show a process flow of manufacturing the bonded structure 1 according to one embodiments. FIG. 2A shows a schematic cross sectional side view of an interconnect structure 10 formed on a carrier 74. In some embodiments, the carrier 74 can comprise a semiconductor or glass carrier. At FIG. 2B, a plurality of dies 12 can be provided on a first side 10a of the interconnect structure 10. The dies 12 can be directly bonded to the interconnect structure 10 without an adhesive (e.g., conductive contacts and nonconductive field regions of the dies 12 and interconnect structure 10 can respectively be directly bonded to one another). At FIG. 2B, a first molding material 16 can also be provided over the first side 10a of the interconnect structure 10, including over the first side 10a of the interconnect structure 10, side surfaces of the dies 12, and upper surfaces of the dies 12. The carrier 74 can be removed from the interconnect layer 10. At FIG. 2C, one or more elements 14 can be provided on a second side 10b of the interconnect structure 10 opposite the first side 10a. In some embodiments, the elements 14 can be directly bonded to the second side 10*b* of the interconnect structure 10 without an adhesive (e.g., conductive contacts and nonconductive field regions of the elements 14 and interconnect structure 10 can respectively be directly bonded to one another). The one or more elements 14 can electrically couple two or more of the plurality of integrated device dies 12 by way of the interconnect structure 10 (e.g., RDL). In some embodiments, the structure shown in FIG. 2C can be a final structure that can be mounted to another device, such as a system board.

At FIG. 2D, a second molding material 18 can be provided at least partially about the elements 14, e.g., over the second side 10*b* of the interconnect structure 10. In the illustrated embodiment, the elements 14 can be completely embedded in the second molding material 18 such that the second molding material 18 covers side and upper surfaces of the elements 14. In some embodiments, the second molding material 18 can comprise a conductive via 70 that extends at least partially though a thickness of the second molding material 18. In some embodiments, the structure shown in FIG. 2D can be a final structure that can be mounted to another device, such as a system board or other device.

At FIG. 2E, a second interconnect structure 20 can be provided. In some embodiments, the structure shown in FIG. 2E can be a final structure that can be mounted to another device, such as a system board or other device. In some embodiments, the structure shown in FIG. 2E can be mounted to a system board or PCB. In other embodiments, multiple structures such as that shown in FIG. 2E can be stacked on one another, or can be stacked on different types of structures such as reconstituted wafers or elements, dies, interposers, etc.

Figure 3A:
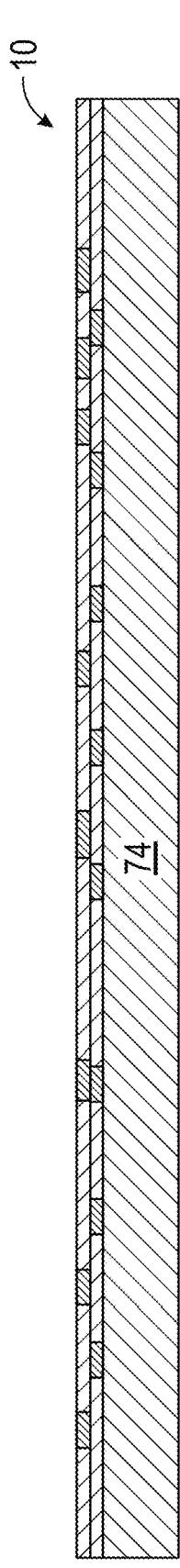
FIG. 3A shows a step in a process of manufacturing a bonded structure according to another embodiment.
Figure 3B:
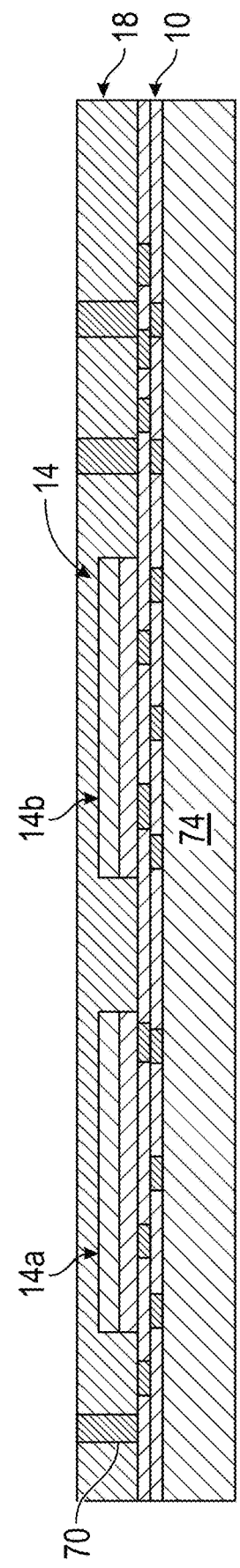
FIG. 3B shows another step in the process of manufacturing a bonded structure after FIG. 3A.

FIGS. 3A-3E show a process flow of manufacturing the bonded structure according to another embodiment. FIG. 3A shows a schematic cross sectional side view of an interconnect structure 10 formed on or in a carrier 74. In some embodiments, the carrier 74 can comprise a semiconductor or glass carrier. At FIG. 3B, one or more elements 14 can be provided on a second side 10*b* of the interconnect structure 10. As explained above, in some embodiments, the elements 14 can be directly bonded to the interconnect structure 10 without an adhesive. A second molding material 18 can be provided at least partially about the elements 14. In some embodiments, the second molding material 18 can comprise a conductive via 70 that extends at least partially through (e.g., completely through) a thickness of the second molding material 18.

Figure 3C:
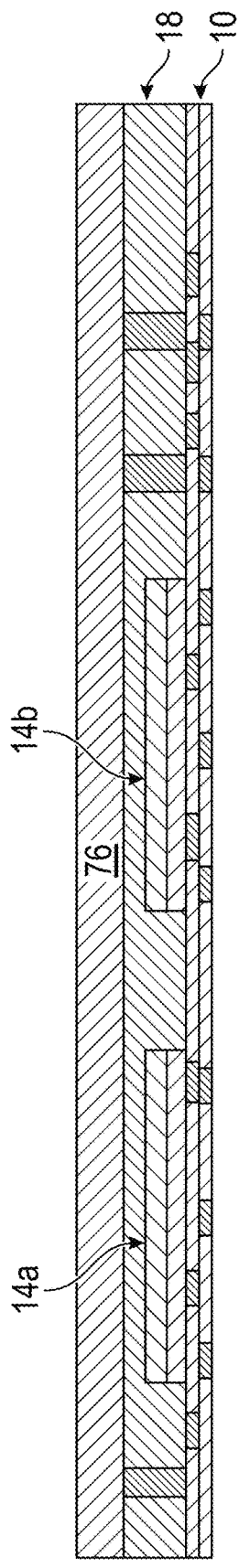
FIG. 3C shows another step in the process of manufacturing a bonded structure after FIG. 3B.
Figure 3D:
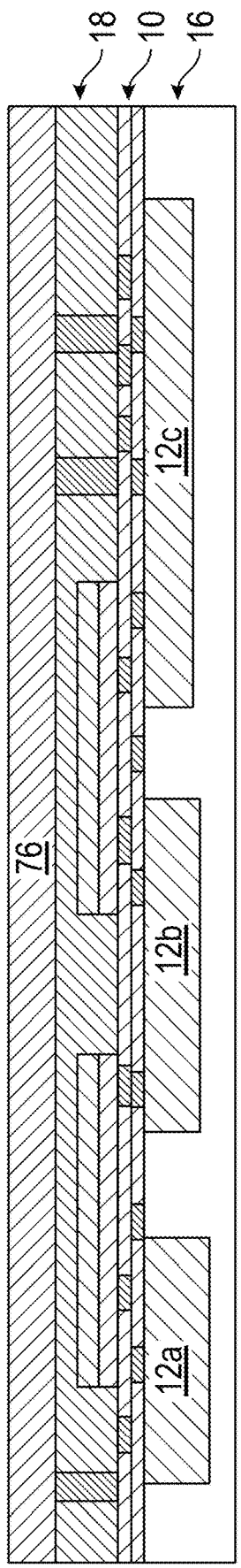
FIG. 3D shows another step in the process of manufacturing a bonded structure after FIG. 3C.
Figure 3E:
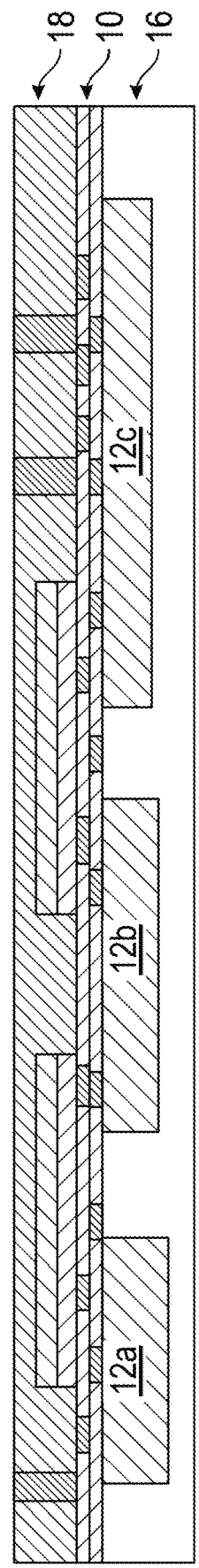
FIG. 3E shows another step in the process of manufacturing a bonded structure after FIG. 3D.

At FIG. 3C, a second carrier 76 can be provided. In some embodiments, the second carrier 76 can comprise a semiconductor or glass carrier. The carrier 74 can be removed from the interconnect layer 10. At FIG. 3D, a plurality of dies 12 can be provided on a first side 10*a* of the interconnect structure 10. As explained above, in some embodiments, the dies 12 can be directly bonded to the interconnect structure 10 without an adhesive. A first molding material 16 can also be provided over the first side 10*a* of the interconnect structure 10. At FIG. 3E, the second carrier 76 can be removed. The structure shown in FIG. 3E can be the same or generally similar as the structure shown in FIG. 2D.

Figure 4:
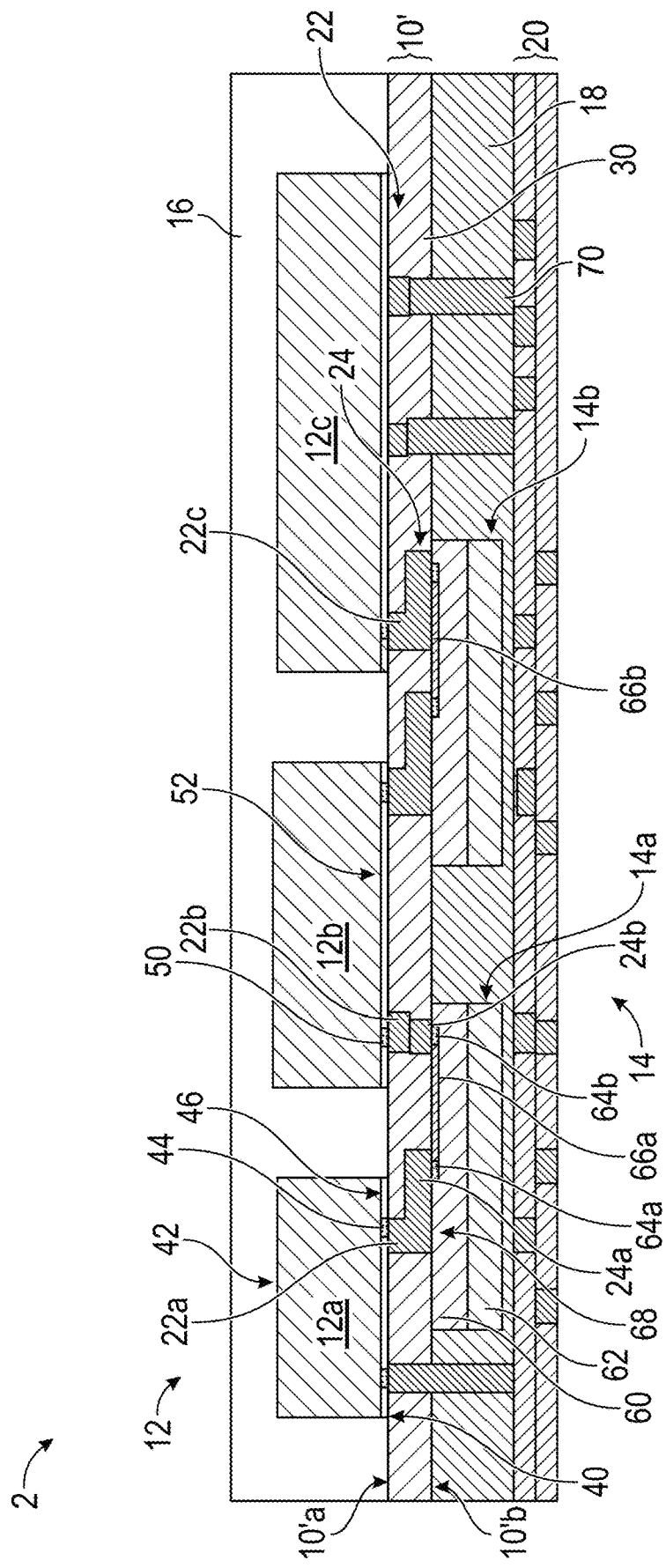
FIG. 4 shows a schematic cross sectional side view of a bonded structure according to another embodiment.

FIG. 4 shows a schematic cross sectional side view of a bonded structure 2 according to an embodiment. Unless otherwise noted, the components of FIG. 4 may be the same as or generally similar to like-numbered components of FIGS. 1A-3E. The bonded structure 2 of FIG. 4 may represent a singulated structure that has been separated (e.g., by sawing or punching) from a reconstituted wafer. The bonded structure 2 can include an interconnect structure 10' that has a first side 10'*a* and a second side 10'*b*, a plurality of integrated device dies 12 (e.g., a first die 12*a*, a second die 12*b*, and a third die 12*c*) that are mounted to the first side 10'*a* of the interconnect structure 10', and a plurality of connecting elements 14 (e.g., a first element 14*a* and a second element 14*b*) that are mounted to the second side 10'*b* of the interconnect structure 10'. The bonded structure can also include a first molding material 16 disposed on the first side 10'*a* of the interconnect structure, a second molding material 18 disposed on the second side 10'*b* of the interconnect structure, and a second interconnect structure 20.

The interconnect structure 10' of FIG. 4, can be generally similar to the interconnect structure 10 illustrated in FIGS. 1A-3E. In the interconnect structure 10', conductive contact pads 22 are not internally connected electrically. For example, the first conductive contact pad 22*a* and the second conductive contact pad 22*b* are not internally connected together electrically within the interconnect structure 10'. Rather, the first conductive contact pad 22*a* and the second conductive contact pad 22*b* are electrically coupled by way of the first conductive contact pad 64*a* and the second conductive contact pad 64*b* of the first element 14*a*, which are respectively connected to the first contact pad 24*a* and the second contact pad 24*b*.

Figure 5:
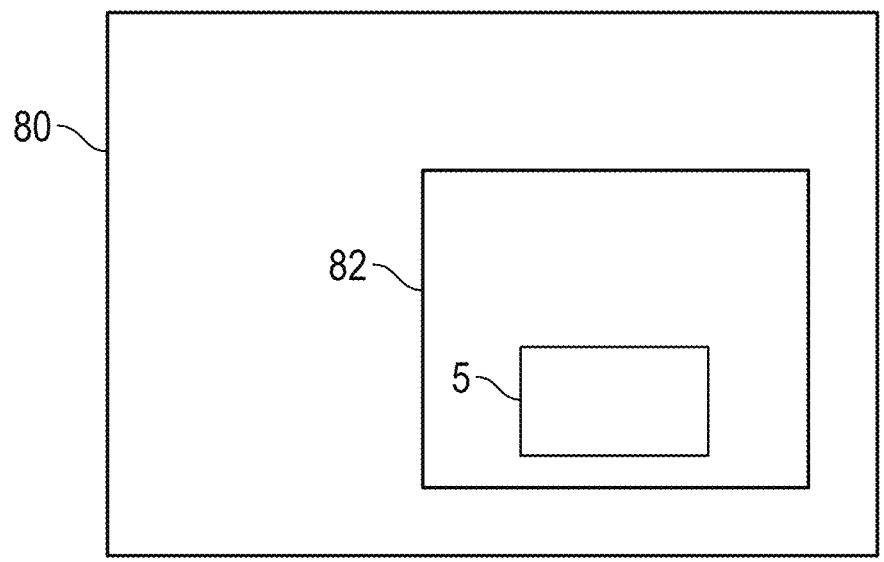
FIG. 5 is a schematic diagram of a system incorporating one or more microelectronic assemblies, according to various embodiments.

FIG. 5 is a schematic diagram of a system 80 incorporating one or more bonded structure 5, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 5. The bonded structures 5 shown in FIG. 5 can comprise any of the bonded structure disclosed herein. The bonded structure 5 can include one or more integrated device dies which perform various functions for the system 80.

In one aspect, a bonded structure is disclosed. The bonded structure can include an interconnect structure that has a first side and a second side opposite the first side. The first side includes a first conductive pad, a second conductive pad, and a non-conductive region. The bonded structure can also include a first die that is mounted and directly bonded to the first side of the interconnect structure. The first die electrically is connected to the first conductive pad of the interconnect structure. The bonded structure can also include a second die that is mounted to the first side of the interconnect structure. The second die is electrically connected to the second conductive pad of the interconnect structure. The second die is spaced apart from the first die laterally along the first side of the interconnect structure. The bonded structure can further include an element that is mounted to the second side of the interconnect structure. The first die and the second die are electrically connected by way of at least the interconnect structure and the element.

In one embodiment, the first die includes a bonding surface. The bonding surface can include a first conductive bond pad and a first non-conductive material. The first conductive bond pad can be directly bonded to the first conductive pad without an intervening adhesive. The first non-conductive material can be directly bonded to a first portion of the non-conductive region without an intervening adhesive. The second die includes a bonding surface. The bonding surface can include a second conductive bond pad and a second non-conductive material. The second conductive bond pad can be directly bonded to the second conductive pad without an intervening adhesive. The second non-conductive material can be directly bonded to a second portion of the non-conductive region without an intervening adhesive.

In one embodiment, the element is directly bonded to the second side of the interconnect structure without an intervening adhesive.

In one embodiment, the first die is mounted to the first side of the interconnect structure by way of a thermal conductive bonding (TCB).

In one embodiment, the interconnect structure includes a redistribution layer (RDL). The RDL layer includes a single layer RDL.

In one embodiment, the element is mounted to the second side of the interconnect structure by way of a thermal conductive bonding (TCB).

In one embodiment, the element includes a third die.

In one embodiment, the element includes a redistribution layer (RDL) formed on a substrate.

In one embodiment, the element include a high density interconnect substrate.

In one embodiment, the bonded structure further includes a first molding material that is disposed over the interconnect structure and at least partially between the first die and the second die.

In one embodiment, the bonded structure further includes a second molding material disposed about the element. The bonded structure can further include a conductive via extending at least through a thickness of the second molding material. The bonded structure can further include a second interconnect structure that is electrically coupled to the interconnect structure through the via. The element can be positioned between the interconnect structure and the second interconnect structure.

In one aspect, a bonded structure is disclosed. The bonded structure can include an interconnect structure that has a first side and a second side opposite the first side. The first side includes a first conductive pad, a second conductive pad, and a non-conductive region. The second side includes a third conductive pad and a fourth conductive pad. The bonded structure can also include a first die that is mounted to the first side of the interconnect structure. The first die is electrically connected to the first conductive pad of the interconnect structure. The bonded structure can also include a second die that is mounted to the first side of the interconnect structure. The second die is electrically connected to the second conductive pad of the interconnect structure. The second die is spaced apart from the first die laterally along the first side of the interconnect structure. The bonded structure further includes an element that is mounted and directly bonded to the second side of the interconnect structure and electrically connected to the third conductive pad and the fourth conductive pad. The element is configured to provide at least a portion of a conductive pathway between the first die and the second die.

In one embodiment, the third conductive pad is laterally offset relative to the first conductive pad.

In one embodiment, the first die includes a bonding surface. The bonding surface can include a first conductive bond pad and a first non-conductive material. The first conductive bond pad can be directly bonded to the first conductive pad without an intervening adhesive. The first non-conductive material can be directly bonded to a first portion of the non-conductive region. The second die can include a bonding surface. The bonding surface can include a second conductive bond pad and a second non-conductive material. The second conductive bond pad can be directly bonded to the second conductive pad without an intervening adhesive. The second non-conductive material can be directly bonded to a second portion of the non-conductive region without an intervening adhesive.

In one embodiment, the element is directly bonded to the second side of the interconnect structure without an intervening adhesive.

In one embodiment, the first die is mounted to the first side of the interconnect structure by way of a thermal conductive bonding (TCB).

In one embodiment, the interconnect structure includes a redistribution layer (RDL). The RDL layer comprises a single layer RDL.

In one embodiment, the element is mounted to the second side of the interconnect structure by way of a thermal conductive bonding (TCB).

In one embodiment, the element includes a third die.

In one embodiment, the element includes a redistribution layer (RDL) formed on a substrate.

In one embodiment, the element includes a high density interconnect substrate.

In one embodiment, the bonded structure further includes a first molding material that is disposed over the interconnect structure at least partially between the first die and the second die.

In one embodiment, the bonded structure further includes a second molding material disposed about the element. The bonded structure can further include a conductive via extending at least through a thickness of the second molding material. The bonded structure can further includes a second interconnect structure that is electrically coupled to the interconnect structure through the via. The element can be positioned between the interconnect structure and the second interconnect structure.

In one aspect, a bonded structure is disclosed. The bonded structure can include an interconnect structure that has a first side and a second side opposite the first side. The first side is configured to support a plurality of dies. The second side includes a first conductive pad, a second conductive pad, and a non-conductive region between the first conductive pad and the second conductive pad. The bonded structure can also include an element that has a bonding surface. The bonding surface includes a first conductive bond pad, a second conductive bond pad, and a non-conductive material between the first conductive bond pad and the second conductive bond pad. The first conductive bond pad and the second conductive bond pad are directly bonded to the first conductive pad and the second conductive pad, respectively, without an intervening adhesive. The non-conductive material is directly bonded to a portion of the non-conductive region. The element is configured to define at least a portion of a conductive pathway between two or more of the plurality of dies.

In one embodiment, the bonded structure further includes a first die that is mounted to the first side of the interconnect structure, and a second die that is mounted to the first side of the interconnect structure. The second die can be spaced apart from the first die laterally along the first side of the interconnect structure. The first die is electrically coupled with the second die by way of at least the interconnect layer and the element. The bonded structure can further include a first molding material disposed over the interconnect structure at least partially between the first die and the second die. The first die can be directly mounted to the first side of the interconnect structure without an intervening adhesive.

In one embodiment, the interconnect structure includes a redistribution layer (RDL). The RDL layer can include a single layer RDL.

In one embodiment, the element includes an integrated device die.

In one embodiment, the element includes a redistribution layer (RDL) formed on a substrate.

In one embodiment, the element includes a high density interconnect substrate.

In one embodiment, the bonded structure further includes a second molding material that is disposed about the element. The bonded structure can further includes a conductive via that extends at least through a thickness of the molding material. The bonded structure can further include a second interconnect structure that is electrically coupled to the interconnect structure through the via. The element is positioned between the interconnect structure and the second interconnect structure.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways.

Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
   an interconnect structure having a first side and a second side opposite the first side, the first side comprising a first conductive pad, a second conductive pad, and a non-conductive region;
   a first die mounted and directly bonded to the first side of the interconnect structure along a bond interface, the first die electrically connected to the first conductive pad of the interconnect structure, the bond interface comprising metal-to-metal direct bonds and dielectric-to-dielectric direct bonds without an intervening adhesive;
   a second die mounted to the first side of the interconnect structure, the second die electrically connected to the second conductive pad of the interconnect structure, the second die spaced apart from the first die laterally along the first side of the interconnect structure; and
   an element mounted to the second side of the interconnect structure,
   wherein the first die and the second die are electrically connected by way of at least the interconnect structure and the element.

2. The bonded structure of claim 1, wherein the first die comprises a bonding surface, the bonding surface comprising a first conductive bond pad and a first non-conductive material, the first conductive bond pad directly bonded to the first conductive pad without an intervening adhesive, and the first non-conductive material directly bonded to a first portion of the non-conductive region without an intervening adhesive.

3. The bonded structure of claim 2, wherein the second die comprises a bonding surface, the bonding surface comprising a second conductive bond pad and a second non-conductive material, the second conductive bond pad directly bonded to the second conductive pad without an intervening adhesive, and the second non-conductive material directly bonded to a second portion of the non-conductive region without an intervening adhesive.

4. The bonded structure of claim 1, wherein the element is directly bonded to the second side of the interconnect structure without an intervening adhesive.

5. The bonded structure of claim 1, wherein the element comprises a silicon substrate.

6. The bonded structure of claim 1, further comprising a first encapsulant disposed over the interconnect structure at least partially between the first die and the second die.

7. The bonded structure of claim 1, further comprising a second encapsulant material disposed about the element.

8. The bonded structure of claim 7, further comprising a conductive via extending at least through a thickness of the second encapsulant material.

9. The bonded structure of claim 8, further comprising a second interconnect structure electrically coupled to the interconnect structure through the via, the element is positioned between the interconnect structure and the second interconnect structure.

10. The bonded structure of claim 1, wherein the element comprises a third die.

11. The bonded structure of claim 1, wherein the bonded structure is mounted on a system substrate, the element disposed between the system substrate and the interconnect structure.

12. The bonded structure of claim 11, wherein the system substrate comprises a printed circuit board.

13. The bonded structure of claim 1, wherein the first die comprises a processor die.

14. The bonded structure of claim 13, wherein the second die comprises a processor die.

15. The bonded structure of claim 1, wherein the interconnect structure comprises a nonconductive material and a plurality of vias to convey signals vertically through the interconnect structure.

16. The bonded structure of claim 15, wherein the interconnect structure comprises a plurality of traces to convey signals laterally through the interconnect structure.

\* \* \* \* \*